US008832926B2

(12) United States Patent
Motowidlo (10) Patent No.: US 8,832,926 B2
(45) Date of Patent: Sep. 16, 2014

(54) METHOD OF MANUFACTURING SUPERCONDUCTOR WIRE

(75) Inventor: Leszek Motowidlo, Southington, CT (US)

(73) Assignee: Supramagnetics, Inc., Plantsville, CT (US)

( * ) Notice: Subject to any disclaimer, the term of this patent is extended or adjusted under 35 U.S.C. 154(b) by 1224 days.

(21) Appl. No.: 12/537,301

(22) Filed: Aug. 7, 2009

(65) Prior Publication Data
US 2010/0031493 A1     Feb. 11, 2010

Related U.S. Application Data

(60) Provisional application No. 61/087,250, filed on Aug. 8, 2008.

(51) Int. Cl.
*H01B 12/10* (2006.01)
*H01L 39/24* (2006.01)

(52) U.S. Cl.
CPC .............. *H01B 12/10* (2013.01); *H01L 39/2409* (2013.01)
USPC ......................................................... 29/599

(58) Field of Classification Search
CPC ....................................................... H01B 12/10
USPC ......................................................... 29/599
See application file for complete search history.

(56) References Cited

U.S. PATENT DOCUMENTS

| 5,534,219 A |   | 7/1996 | Marancik et al. |        |
|---|---|---|---|---|
| 7,459,030 B2 | * | 12/2008 | Miyazaki et al. | 148/98 |
| 7,566,414 B2 | * | 7/2009 | Miyazaki et al. | 419/8 |

FOREIGN PATENT DOCUMENTS

| JP | 60151907 A | * | 8/1985 |
|---|---|---|---|
| JP | 04095317 A | * | 3/1992 |
| JP | 04132115 A | * | 5/1992 |

OTHER PUBLICATIONS

Wong, T.; Renaud, C.V.; , "Ti and Ta additions to Nb3Sn by the powder in tube process," Applied Superconductivity, IEEE Transactions on , vol. 11, No. 1, pp. 3584-3587, Mar. 2001.*
Renaud, C.V., Jr.; Motowidlo, L.R.; Wong, T.; , "Status of powder-in-tube Nb3Sn conductor development at Supercon," Applied Superconductivity, IEEE Transactions on , vol. 13, No. 2, pp. 3490-3493, Jun. 2003.*
Elen et al., Development of Stabilized Nb3Sn Wire Containing a Reduced Number of Filaments, IEEE Transactions on Magnetics, vol. Mag-17, No. 1, Jan. 1981.*
Eric Gregory, "Multifilamentary Superconducting Composites", Concise Encyclopedia of Magnetic and Superconducting Materials, p. 332, 1992, Editor Jan Evetts, Pergamon Press.
C.A.M. van Beijen et al., Multifilament Nb3 Sn Superconductors Produced by the E.G.N. Technique IEEE Transactions on Magnetics, vol. MAG-15, 87, Jan. 1979.
J. A. Parrell et al. "High Field Nb3 Sn Conductor Development at Oxford Superconducting Technology", IEEE Transactions on Applied Superconductivity, vol. 13, No. 2, p. 3470, Jun. 2003.

(Continued)

*Primary Examiner* — Livius R Cazan
(74) *Attorney, Agent, or Firm* — Katten Muchin Rosenman LLP (57) ABSTRACT

A method for forming $Nb_3Sn$ superconducting wire is provided. The method employs a powder-in-tube process using a high-tin intermetallic compound, such as $MnSn_2$, for producing the $Nb_3Sn$. The use of a high-tin intermetallic compound enables the process to perform hot extrusion without melting the high-tin intermetallic compound. Alternatively, the method may entail drawing the wire without hot extrusion.

12 Claims, 8 Drawing Sheets

(56) References Cited

OTHER PUBLICATIONS

B. A. Zeitlin, et al. "Results on Mono Element Internal Tin Nb3Sn Conductors (MEIT) with Nb7.5Ta and Nb(1Zr+Ox) Filaments", IEEE Transactions on Applied Superconductivity, vol. 15. No. 2, pp. 3393, Jun. 2005.

H. Krauth, et al. "Some Remarks on the Development of Commercial NbTi and Nb3Sn Superconductors", in Progress on Nb-Based Superconductors, p. 91, Editors, K. Inoue, T. Takeuchi, and A. Kikuchi, Feb. 2-3, 2004.

L. R. Motowidlo et al. "A Nb3Sn Conductor via CU5SN4 PIT Process for High Field Applications", Advances in Cryogenic Engineering: Transactions of the International Cryogenic Materials Conference, vol. 54, p. 269, Jul. 16-20, 2007.

Arno Godeke, "Performance Boundaries in Nb3Sn Superconductors", Ph.D. Thesis, Jun. 2005.

* cited by examiner

PRIOR ART

METHOD OF MANUFACTURING SUPERCONDUCTOR WIRE

CROSS-REFERENCE TO RELATED APPLICATIONS

This application claims priority benefit of U.S. Provisional Patent Application No. 61/087,250, filed Aug. 8, 2008, the contents of which are incorporated herein by reference in their entirety.

This invention was made under a contract with the United States Government Department of Energy, Contract No. DE-FG02-06ER84482.

BACKGROUND OF THE INVENTION

1. Field of the Invention

The present invention relates to manufacturing of superconductor wire. More particularly, the invention relates to a method for manufacturing superconductor wire using high-tin compounds that have high melting temperatures.

2. Related Art

The conventional internal-tin process (IT) (see Eric Gregory, "Multifilamentary Superconducting Composites", Concise Encyclopedia of Magnetic and Superconducting Materials, p. 332, 1992, Editor Jan Evetts, Pergamon Press, the contents of which are incorporated herein by reference in their entirety) and the conventional powder-in-tube process (PIT) (see C. A. M. van Beijen and J. D. Elen, IEEE Trans. Magn., MAG-15, 87, 1979, the contents of which are incorporated herein by reference in their entirety; and J. H. Lindenhovius, "SMI Activities and Plans on PIT $Nb_3Sn$", WAMS, Archamps, Mar. 23, 2004, the contents of which are incorporated herein by reference in their entirety) are the leading $Nb_3Sn$ conductor manufacturing approaches that have the potential to meet the High Energy Physics (HEP) goals of performance and cost for high field magnets such as the LHC luminosity upgrade. Along with the standard bronze process, schematics of both approaches are compared in FIG. 1. The main advantage of both the IT and PIT approaches is that they have more tin available (up to 20%) for $Nb_3Sn$ formation, where as the bronze approach is limited to 13% by weight. See A. Godeke, "Performance Boundaries in $Nb_3Sn$ Superconductors", Ph.D. Thesis, 2005, University of Twente, Enshede, The Netherlands, the contents of which are incorporated herein by reference in their entirety.

Because of the higher availability of tin in both the IT and PIT approaches, significant progress has been achieved toward improving the non-Cu JC (critical current density, Amps/$mm^2$) performance. For example, the performance goal set by the conductor advisory group has been attained by the IT approach. See R. M. Scanlan and D. R. Dietderich, "Progress and Plans for the U.S. HEP Conductor Development Program", IEEE Trans. On Appl. Super., Vol. 13, No. 12, p. 1536, June 2002, the contents of which are incorporated herein by reference in their entirety. The $J_c$ (12T, 4.2K) has been reported at or exceeding the 3,000 A/$mm^2$. See J. A. Parrell et al., "High Field $Nb_3Sn$ Conductor Development at Oxford Superconducting Technology", IEEE Trans. On Appl. Super., Vol. 13, No. 2, p. 3470, June 2003, the contents of which are incorporated herein by reference in their entirety. The non-Cu J achieved by the PIT approach is about 2,400 A/$mm^2$ at 12T. See Lindenhovius, supra. These high $J_c$ performance characteristics are not possible with the bronze process due to lower tin availability.

Both the IT and PIT begin with a subelement. See Gregory, supra, and Godeke, supra. In the case of the IT, a Cu/Nb composite with solid niobium filaments imbedded in the copper matrix is hot extruded. After extrusion, the composite is gun drilled to form a hole at the center of the array of niobium filaments. A solid tin rod is then inserted into this composite and further processed to a size for restacking into a copper tube for design and fabrication of a multifilament conductor. The restacked billet is then cold drawn to final wire size.

In the case of the PIT approach, a copper-clad niobium tube is filled with an intermetallic $NbSn_2$ powder compound, plus additional free tin and copper powder. The PIT subelement is then processed to a final restack size and, like the IT approach, is assembled into another copper tube to fabricate the final multifilament wire.

A weakness of the IT process is the additional cost involved in gun drilling a long length of extruded composite rod. A weakness of the PIT approach is the inherent high cost of preparing the $NbSn_2$ intermetallic powder due to high cost of niobium and processing.

The cost to fabricate the IT $Nb_3Sn$ superconductors is on the order of $2 to $4 per meter. The cost associated with the PIT process is currently greater than $4 per meter. In contrast, the cost of state-of-the-art NbTi superconductors manufactured for the MRI industry is on the order of $0.50 to $1.00 per meter. See L. D. Cooley, A. K. Ghosh, and R. M. Scanlan, "Costs of high field superconducting magnet strands", the contents of which are incorporated herein by reference in their entirety. If the cost of a $Nb_3Sn$ process could be reduced to the same level as the current state-of-the-art production levels of NbTi, then this higher performance conductor could become the conductor of choice for various commercial applications such as for example MR imaging and NMR spectroscopy. A low cost $Nb_3Sn$ conductor could allow magnet engineers new design opportunities toward reducing volume and weight of the overall magnet for a given applied magnetic field without sacrificing performance. Such a conductor would also have significant cost implications for large scale magnet projects such as upgrades for the Large Hadron Collider and the International Fusion machine.

Figure 1:
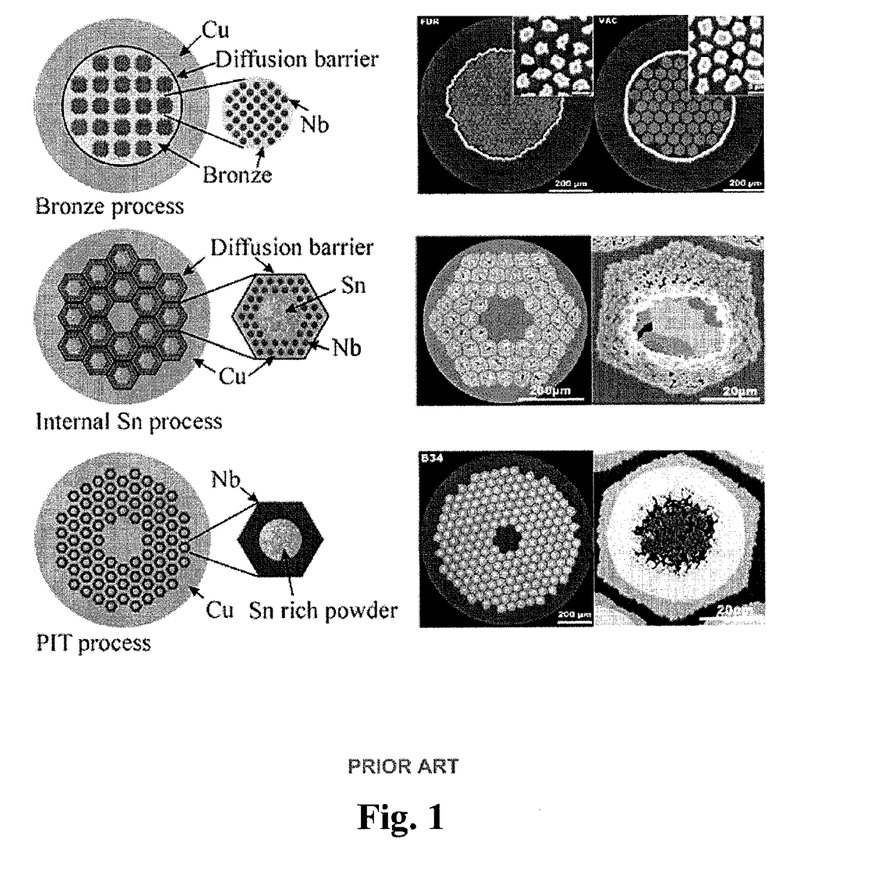
FIG. 1 illustrates schematics of several conventional $Nb_3Sn$ manufacturing process designs.

Earlier conductor developments have replaced the solid tin core of the sub-element in the IT process with salt cores. See W. Marancik, S. Hong, and R. Zhou, "Method for Producing Multifilamentary Niobium-Tin Superconductor", U.S. Pat. No. 5,534,219, Jul. 9, 1996, the contents of which are incorporated herein by reference in their entirety. The sub-elements with the salt cores are then assembled into a multifilament array as schematically depicted in FIG. 1. This assembly is then hot extruded. The result is a fully bonded multifilament composite with removable inert salt cores. The inert salt cores are then dissolved with jets of water leaving behind longitudinally extended channels which are symmetrically distributed with reference to the transverse cross-section of the conductor. These channels are then filled with solid tin followed by further drawing the composite to a final wire size.

In practice, the size of the salt cores need to be relatively large after extrusion in order to dissolve the salts with jets of water. However, in modern high critical current IT conductors (for example RRP process, see Parrell, supra), it is desirable to increase the number of sub-elements such that the sub-element diameter is less than 100 microns at final wire diameter. This means the sub-elements with the salt cores would be too small for practical removal by water jet dissolution of the salts. Thus, the approach has been limited to a small number of sub-elements that may be designed into a multifilament billet.

Another recent IT development to reduce cost is the "Mono Element Internal Tin (MEIT) conductor. See B. A. Zeitlin, B. Gregory, J. Marte, M. Benz, T. Pyon, R. Scanlan, and D.

Figure 2:
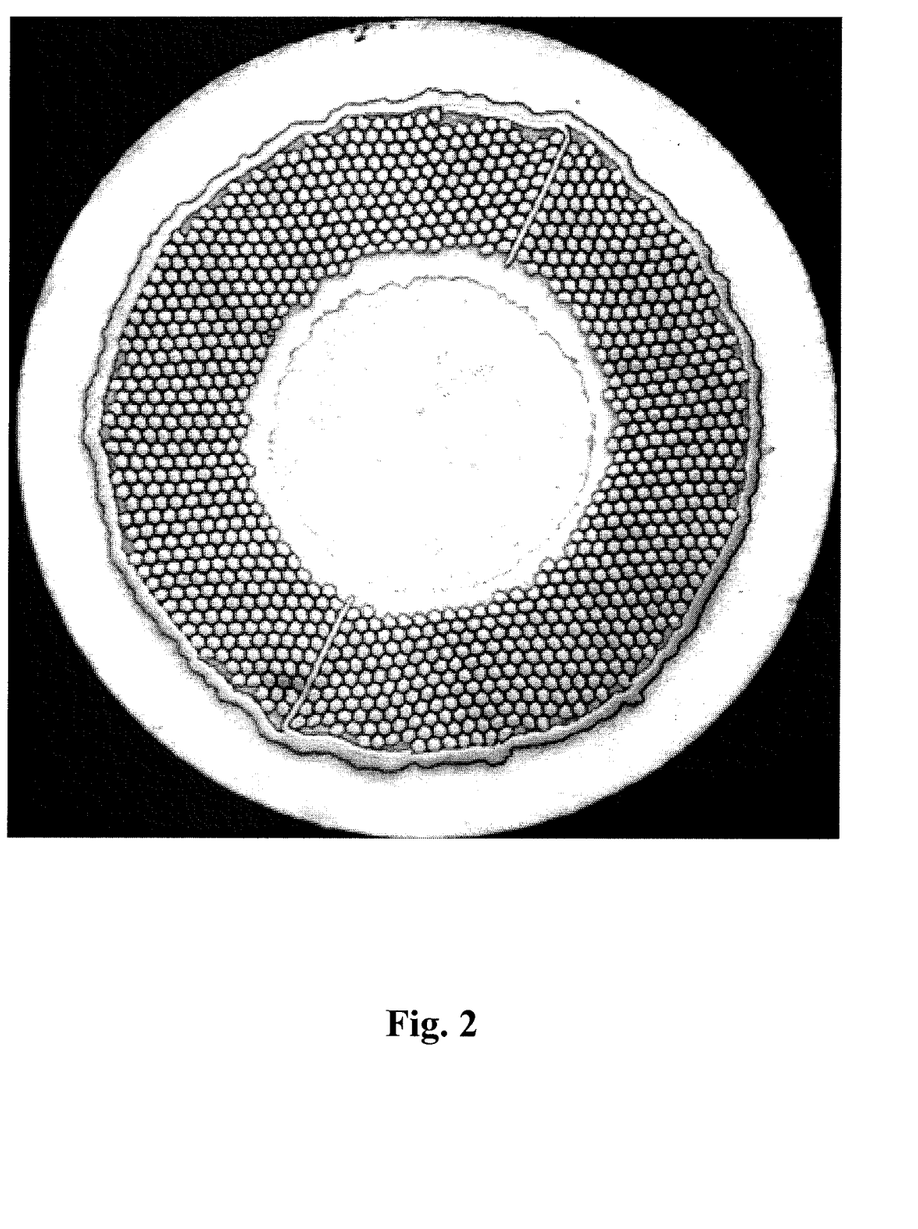
FIG. 2 shows an exemplary Mono Element Internal Tin (MEIT) conductor design.

Dietderich, "Results on Mono Element Internal Tin Nb3Sn Conductors (MEIT) with Nb7.5Ta and Nb(1Zr+Ox) Filaments", IEEE Trans. on Appl. Supercond., Vol. 15. No. 2, pp. 3393, June 2005, the contents of which are incorporated herein by reference in their entirety. The approach in this process reduces the steps by eliminating the final restack assembly of 19 or 37 IT sub-elements as depicted in the schematic of FIG. 1. In this approach, the sub-element is hot extruded and drawn into a multifilament wire. This approach takes advantage of the cost effective large scale assembly of the subelement in a similar manner to MRI production size NbTi billets. However, a weakness of this approach is the fact that after extrusion, the composite must be gun-drilled to form a hole for the insertion of solid tin. This operation is expensive since very few companies worldwide specialize in this operation for superconducting composites. Moreover, gun-drilling a long length rod could result in an off center hole and damage the inner filaments. Furthermore, MRI extruded production scale rods are about 3 to 4 inches in diameter, 30 feet long and not perfectly straight. Technology to drill a straight hole over such a length does not exist. An example of MEIT conductor design is shown in FIG. 2. The central region is filled with solid tin after the extrusion and is surrounded by an array of solid niobium filaments in a copper matrix.

In the PIT process, $NbSn_2$ is the high tin source with about 72% tin by weight. It is an extremely hard compound and difficult to fracture, making this approach expensive to fabricate. Drawing this wire with PIT sub-elements containing the hard $NbSn_2$ is difficult. The addition of ductile tin powder to micron size $NbSn_2$ powder in early as well as more recent advanced designs of PIT wires enables processing long piece lengths of wire. See H. Krauth, A. Szulczyk, M. Thoener, and J. Lindenhovius, "Some Remarks on the Development of Commercial NbTi and $Nb_3Sn$ Superconductors", in Progress on Nb-Based Superconductors, p. 91, Editors, K. Inoue, T. Takeuchi, and A. Kikuchi, Feb. 2-3, 2004, the contents of which are incorporated herein by reference in their entirety; C. V. Renaud, L. R. Motowidlo, and T. Wong, "Status of powder-in-tube $Nb_3Sn$ conductor development at Supercon", IEEE Trans. Appl. Supercond., Vol. 13, No. 2, pp. 3490-3493, 2003, the contents of which are incorporated herein by reference in their entirety; and L. R. Motowidlo and G. M. Ozeryansky, "A $Nb_3Sn$ Conductor via $Cu_5Sn_4$ PIT Process for High Field Applications", Adv. In Cryo. Eng., Vol. 54, p. 269, Jul. 16-20, 2007, the contents of which are incorporated herein by reference in their entirety. See also Matt Jewell et al., "Novel Approaches to Forming $Nb_3Sn$", 2005 Low Temperature Workshop, Napa, Calif., the contents of which are incorporated herein by reference in their entirety. Low temperature hydrostatic extrusion of PIT composite wires is presently being explored by groups in Europe to develop a large-scale process. However, reports so far indicate some difficulties with wire drawing. This may be due to the hard nature of $NbSn_2$ and/or the lack of true bonding from low temperature hydrostatic extrusion. Moreover, it is still an expensive process due to the inherent high cost of the micron size Nb powder and the high cost of processing to form the intermetallic micron size $NbSn_2$ powder. Furthermore, large scale hydrostatic presses are few worldwide with limited access for extrusion.

Figure 3A:
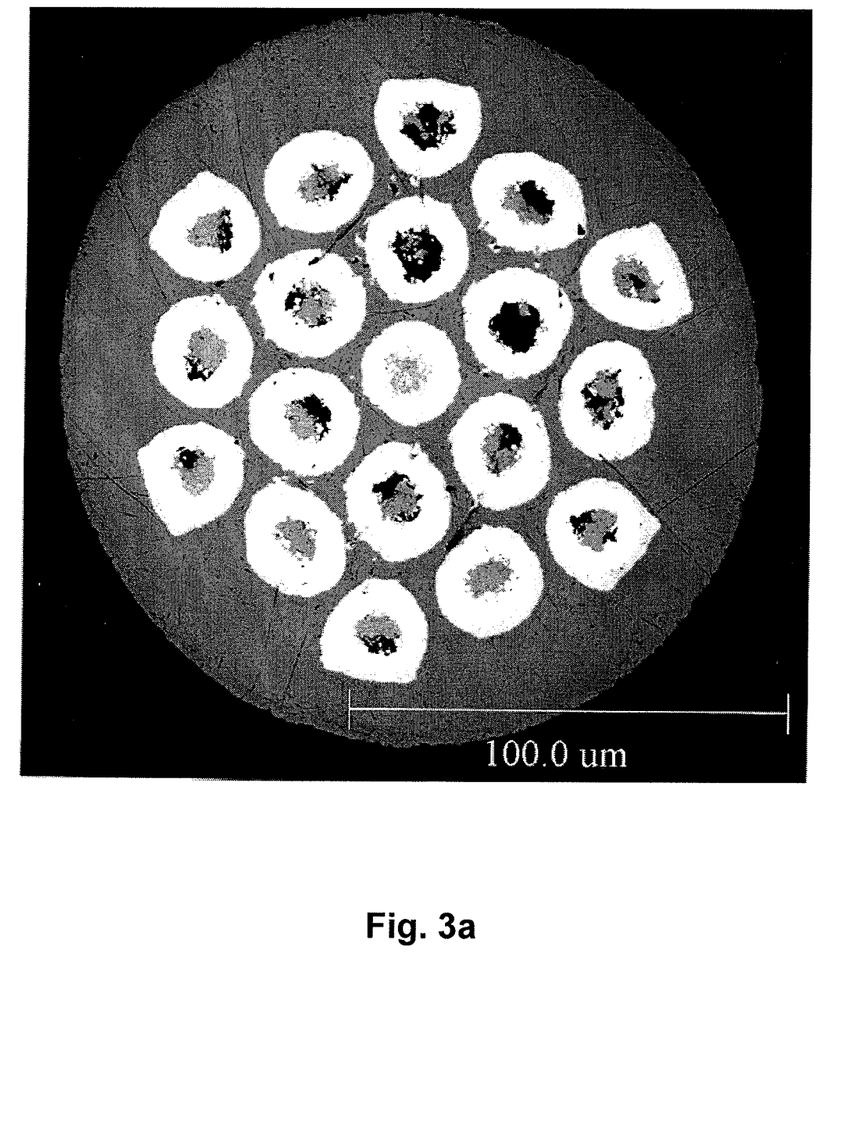
FIGS. 3a and 3b illustrates a porosity and a large grain size of PIT $Nb_3Sn$ wire utilizing $Cu_5Sn_4$ cores.
Figure 3B:
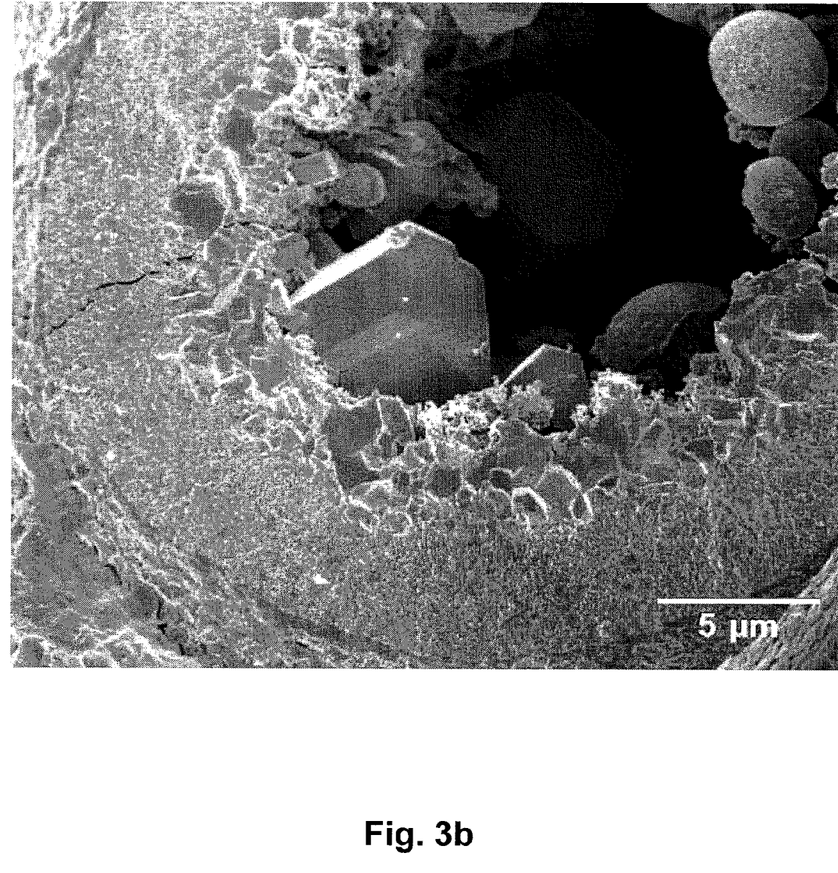

Referring to FIGS. 3a and 3b, in general, PIT $Nb_3Sn$ wire utilizing $NbSn_2$ or $Cu_5Sn_4$ has shown a porous remnant of the core after final reaction and diffusion of the tin into the niobium tube. Another general feature of PIT $Nb_3Sn$ wires is large A15 grains on the inner diameter of the reacted layer. Both features are undesirable. These general features have also been observed in recent PIT development work with $FeSn_2$, $Ni_3Sn_4$, and $YSn_2$ high-tin compounds. See L. R. Motowidlo, "An Extrudable Low-Cost $Nb_3Sn$ PIT Conductor for Applications to HEP Magnets", Phase II SBIR ER84482, the contents of which are incorporated herein by reference in their entirety. FIG. 3 illustrates a porosity and a large grain size of PIT $Nb_3Sn$ wire utilizing $Cu_5Sn_4$ cores.

In summary, both of the conventional IT and PIT processes have not achieved simultaneously all the cost/performance goals for a true manufacturing process suitable for production and application of advanced high energy accelerator magnets, fusion magnets, or commercial MRI and NMR magnets. A truly low-cost manufacturing process for $Nb_3Sn$ conductors, like the state-of-the-art NbTi utilized in commercial MRI machines, has not been fully established to date, and thus, the present inventors have recognized that there is a need for such a process.

SUMMARY OF THE INVENTION

In one aspect, the invention provides a method of manufacturing $Nb_3Sn$ superconductor wire. The method comprises the steps of: producing a high-tin intermetallic powder compound; preparing a catalyst powder compound; mixing the high-tin intermetallic powder compound with the catalyst powder compound to produce an intermetallic powder mixture; introducing the intermetallic powder mixture into a tube to form a mono-element, the tube including copper cladding and the tube comprising one of niobium or a niobium alloy; cold-drawing the mono-element to a first predetermined diameter; assembling a plurality of mono-elements into a multi-element billet; hot-extruding the assembled multi-element billet to produce at least one multifilament billet containing $Nb_3Sn$; and forming a wire having a second predetermined diameter by cold-drawing the at least one multifilament billet through a plurality of dies. The high-tin intermetallic compound may comprise $MnSn_2$.

The step of producing the high-tin intermetallic $MnSn_2$ compound may include the steps of: introducing a first predetermined amount of elemental manganese into a mixer or shaker; introducing a second predetermined amount of elemental tin into the mixer or shaker; mixing the elemental manganese with the elemental tin to produce a combination of manganese and tin; subjecting the combination of manganese and tin to a heat treatment such that $MnSn_2$ is produced; mechanically grinding the produced $MnSn_2$ into a first plurality of particles having a particle size not exceeding a first predetermined maximum size; and jet milling the first plurality of particles into a second plurality of particles having a particle size not exceeding a second predetermined maximum size. The first predetermined amount of elemental manganese may be approximately equal to 19% by weight of the combination of manganese and tin, and the second predetermined amount of elemental tin may be approximately equal to 81% by weight of the combination of manganese and tin. The first predetermined amount of elemental manganese may include a first plurality of manganese particles, each of the first plurality of manganese particles having a size less than or equal to 44 microns. The second predetermined amount of elemental tin may include a second plurality of tin particles, each of the second plurality of tin particles having a size less than or equal to 44 microns.

The step of mixing may further comprise mixing the manganese with the tin under an argon atmosphere. The step of subjecting the combination of manganese and tin to a heat treatment may further comprise subjecting the combination of manganese and tin to a temperature of approximately 500° C. for approximately 72 hours. The first predetermined maximum size may be equal to 150 microns. The second predetermined maximum size may be equal to 5 microns.

The catalyst powder compound may comprise CuTiSn. The step of preparing the catalyst CuTiSn compound may comprise the steps of: introducing a first predetermined amount of elemental copper into a mixer or shaker; introducing a second predetermined amount of elemental titanium into the mixer or shaker; introducing a third predetermined amount of elemental tin into the mixer or shaker; subjecting the combination of copper and titanium and tin to a heat treatment such that CuTiSn is produced; mechanically grinding the produced CuTiSn into a first plurality of particles having a particle size not exceeding a first predetermined maximum size; and jet milling the first plurality of particles into a second plurality of particles having a particle size not exceeding a second predetermined maximum size. The third predetermined amount of elemental tin may be approximately equal to 38% by weight of the combination of copper and titanium and tin.

The step of mixing the high-tin intermetallic powder compound with the catalyst powder compound to produce an intermetallic powder mixture may further comprise mixing a first amount of the high-tin intermetallic powder compound with a second amount of the catalyst powder compound to produce an intermetallic powder mixture, wherein the first and second amounts are selected in accordance with a predetermined ratio. The predetermined ratio may be approximately equal to 1:1. When the tube comprises a niobium alloy, the niobium alloy may be selected from the group consisting of the compositions of Nb-1% Zr, Nb-1% Zr-x % Gd, Nb-1% Zr-x % Y, and Nb-1% Zr-x % Nd.

In another aspect, the invention provides a method of manufacturing $Nb_3Sn$ superconductor wire. The method comprises the steps of: producing a high-tin intermetallic powder compound; preparing a catalyst powder compound; mixing the high-tin intermetallic powder compound with the catalyst powder compound to produce an intermetallic powder mixture; introducing the intermetallic powder mixture into a tube to form a mono-element, the tube including copper cladding and the tube comprising one of niobium or a niobium alloy; cold-drawing the mono-element to a first predetermined diameter; assembling a plurality of mono-elements into a multi-element billet; cold-drawing the assembled multi-element billet into at least one multifilament billet; and forming a wire having a second predetermined diameter by cold-drawing the at least one multifilament billet through a plurality of dies. The high-tin intermetallic compound may comprise $MnSn_2$. The catalyst powder compound may comprise CuTiSn. When the tube comprises a niobium alloy, the niobium alloy may be selected from the group consisting of the compositions of Nb-1% Zr, Nb-1% Zr-x % Gd, Nb-1% Zr-x % Y, and Nb-1% Zr-x % Nd.

DETAILED DESCRIPTION OF THE INVENTION

In order to attain a low cost PIT process for an advanced multifilament $Nb_3Sn$ design, new intermetallic compounds with tin must be substituted for $NbSn_2$. In addition, a lower cost Nb alloy tube must be substituted for the current Nb7.5Ta tube utilized in state-of-the-art PIT conductors.

It is an object of this invention to utilize a new high-tin intermetallic powder compound. In a preferred embodiment, this intermetallic compound is $MnSn_2$. Another object of this invention is to utilize a Nb-1% Zr alloy tube. The purpose of Nb-1% Zr is to reduce the cost of the tube from approximately $288/lb to approximately $90/lb.

$MnSn_2$ has a melting point of about 550° C. and contains 81% tin by weight. This particular compound has unique unexpected characteristics. An important characteristic discovered while investigating this compound was the result of a solid core within the PIT sub-elements after the heat treatment reaction was complete. This is shown in FIG. 4a. Porosity within state-of-the-art PIT $Nb_3Sn$ conductors is an undesirable by-product of this process as shown in FIGS. 3a and 3b. A porous core within each PIT sub-element adjacent to the brittle $Nb_3Sn$ reacted layer does not provide any mechanical support. The lack of mechanical support may cause cracks within the reacted $Nb_3Sn$ layer if external stresses are applied to the conductor. These hoop stresses on the conductor are produced due to the so-called Lorentz forces during operation of an electromagnet.

Another interesting feature discovered with $MnSn_2$ as the high-tin source are the grains at the interface between the $Nb_3Sn$ layer and the $MnSn_2$ PIT core. The size of the grains and more importantly the overall thickness of this region are compared to the $Nb_3Sn$ layer in FIG. 4b. The overall thickness of the grains at the $Nb_3Sn$ layer/PIT core interface are smaller in comparison to the large grain remnants and thickness obtained after reaction in the state-of-the-art PIT wire shown in FIGS. 3a and 3b. This is also an important result since large grains do not contribute substantially to the performance of the conductor as do the small grain region of the $Nb_3Sn$ layer. Reducing the layer thickness or eliminating this large grain region may improve the overall PIT efficiency of the noncopper area and increase relatively the small grain region for higher superconducting transport.

Both features are believed to be unique to the $MnSn_2$ compound and in contrast to other PIT conductors that exhibit porous and large grains after reaction.

Method of Manufacture

Preparation of the Intermetallic Powder Compound

Figure 4:
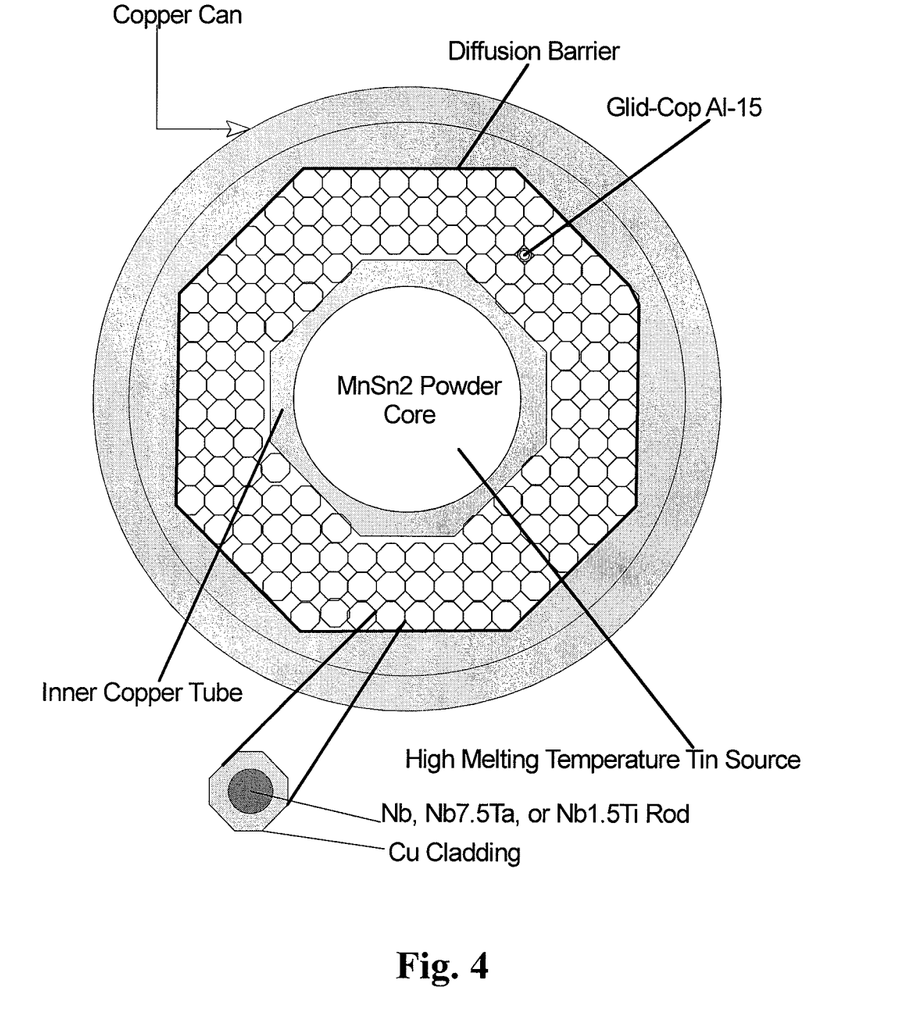
FIG. 4a shows an analysis of and an illustration of a solid core within the PIT sub-elements after completing a heat treatment reaction as part of a method of manufacturing $Nb_3Sn$ superconductor wire using a PIT process according to a preferred embodiment of the present invention according to FIG. 4.
FIG. 4b illustrates a PIT core interface with a reaction layer as observed while performing a method of manufacturing $Nb_3Sn$ superconductor wire using a PIT process according to a preferred embodiment of the present invention.
Figure 4A:
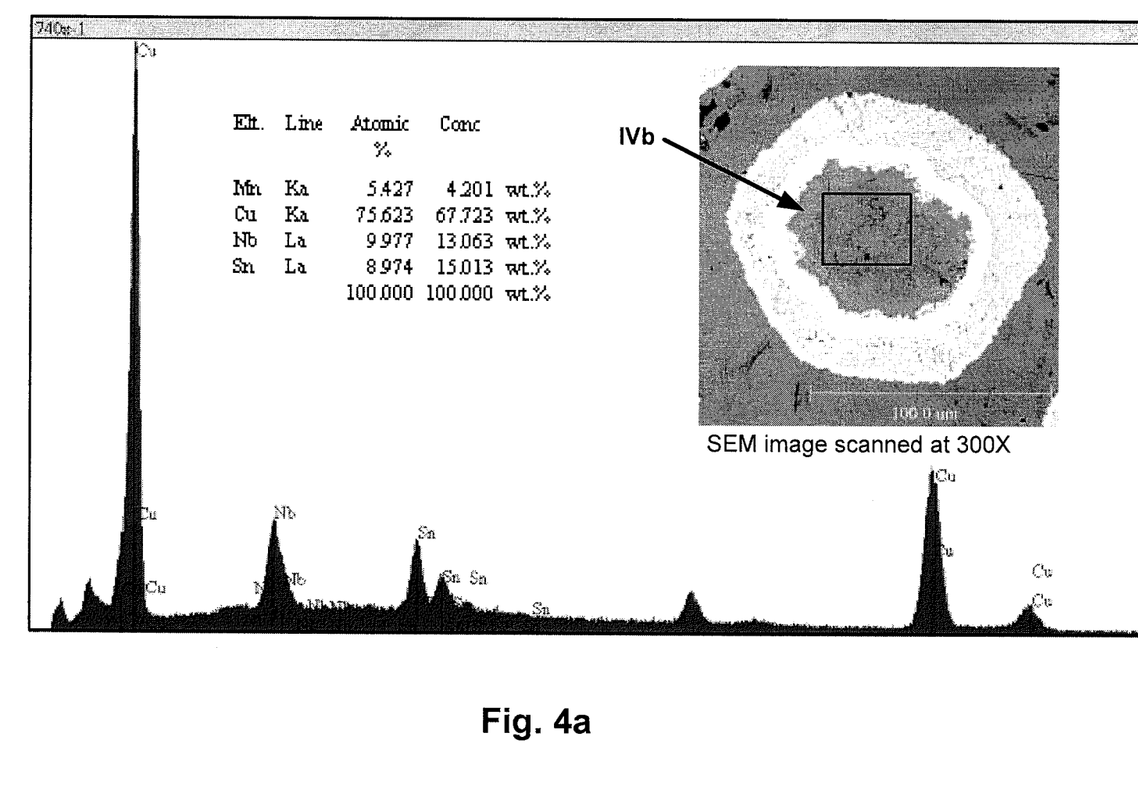
Figure 4B:
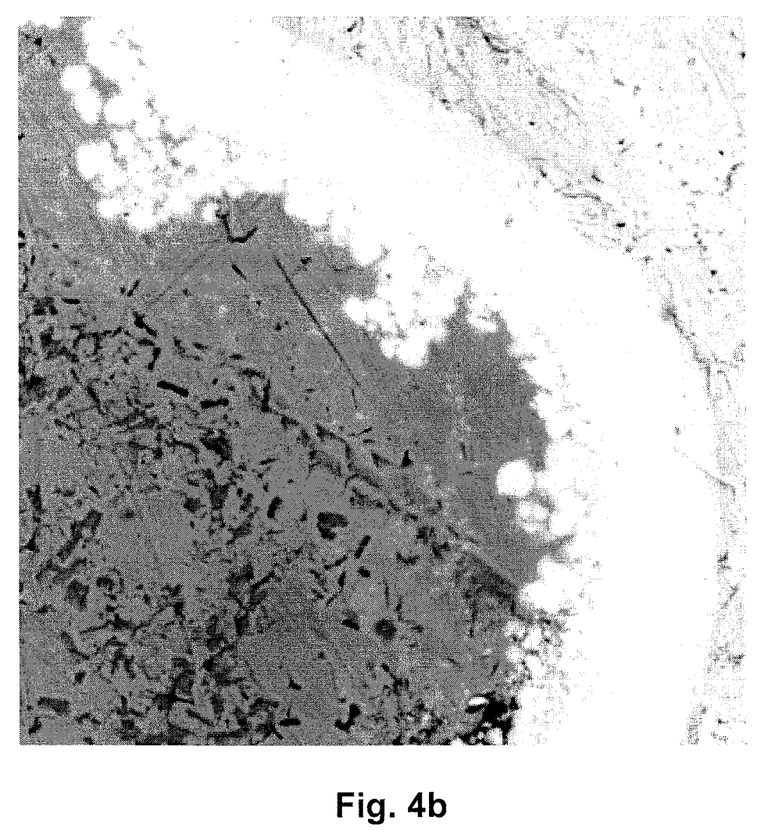
Figure 5:
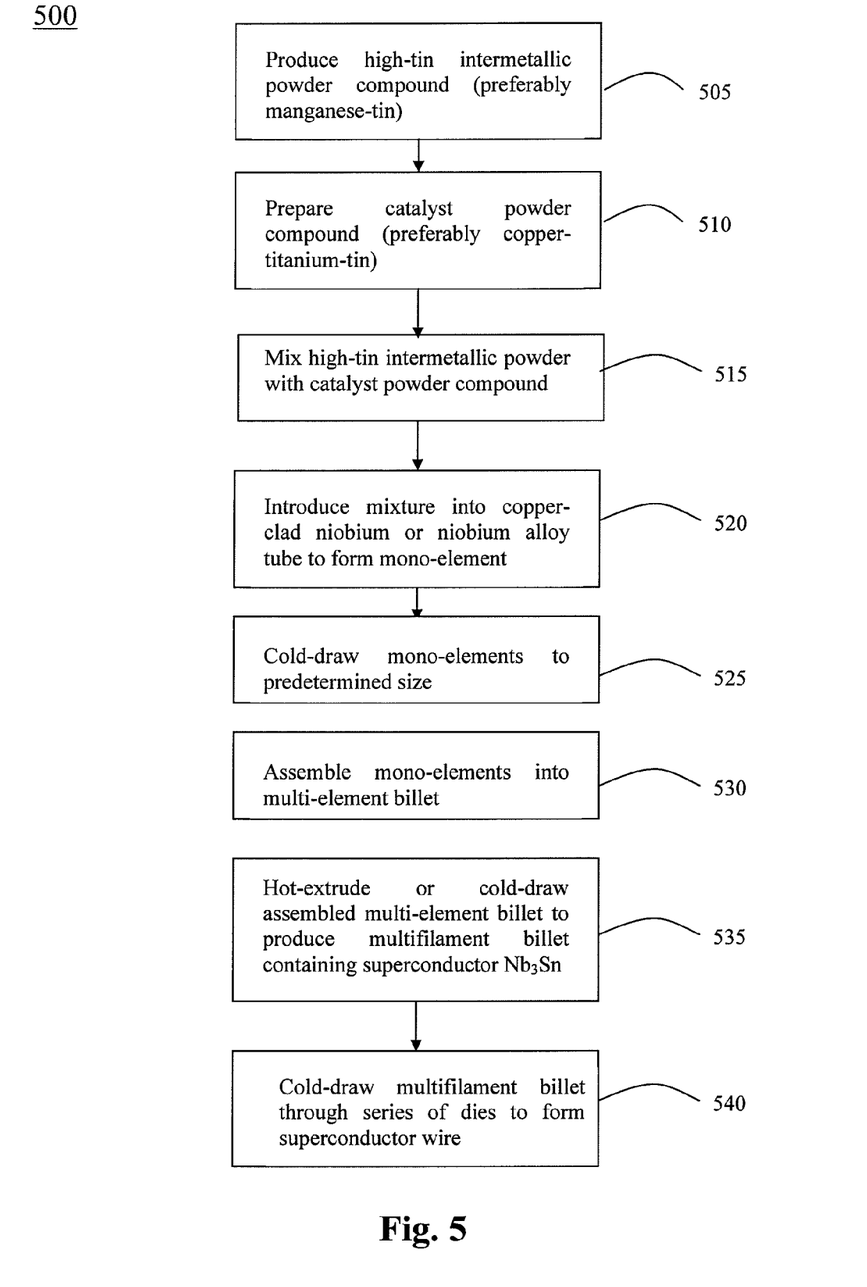
FIG. 5 shows a flow chart that illustrates a method of manufacturing $Nb_3Sn$ superconductor wire using a high-tin intermetallic compound such as manganese-tin, according to a preferred embodiment of the present invention.

Referring to FIG. 5, flow chart 500 illustrates a method of manufacturing superconductor wire using a high-tin intermetallic powder compound according to a preferred embodiment of the present invention as shown in FIG. 4. In the first step 505, elemental manganese and tin having up to 44 micron particle size is weighted to include 81% tin by weight tin and 19% manganese by weight, then mixed in a SPEX 8000 mixer/mill or production size shaker under an argon atmosphere. Depending on the billet size, an appropriate amount of phase pure $MnSn_2$ is prepared. In the case of $MnSn_2$, it was found that a heat treatment condition of 500° C. for 72 hours is appropriate. Variation from this temperature and time may be applied to produce nearly phase pure material. Once the compound has been produced, mechanical grinding by a mortar and pestle produces less than 150 micron particle size. Further processing is performed by jet milling the $MnSn_2$ compound to less than 5 microns. In the second step 510, a catalyst powder compound is prepared. In order to promote the reaction of tin with the Nb or Nb alloy tube, copper must be included in the core. Copper is a necessary catalyst to form $Nb_3Sn$. Also, titanium is included to enhance the critical magnetic field. In this process, we preferably prepare a CuTiSn compound containing 38% tin by weight and 10% titanium by weight; however, other weight percentages of tin and titanium may be used. This compound is prepared by weighing elemental copper, titanium, and tin with starting particle size of about 44 micron size. The fabrication of the CuTiSn compound to less than 5 microns is performed in a similar method described for the fabrication of $MnSn_2$. In the third step 515, once both compositions have been prepared, the intermetallic powders are mixed and blended together using a mechanical mixer. The combination of $MnSn_2$ and CuTiSn is prepared in the ratio of 1 to 1. This PIT composition provides a sufficiently thick $Nb_3Sn$ layer of approximately 10 microns as shown in FIG. 4b. Reducing the CuTiSn addition to 20 wt % will increase the tin content of the PIT core and may further increase the $Nb_3Sn$ layer thickness.

Preparation of the PIT Sub-Element and Multifilament Processing

In the fourth step 520, after preparation of the PIT $MnSn_2$+CuTiSn core composition, the intermetallic compound is introduced into a niobium or niobium alloy tube to form a mono-element or sub-element. The niobium alloy tube may be a composition of Nb-1% Zr, Nb-1% Zr-x % Gd, Nb-1% Zr-x % Y, Nb-1% Zr-x % Nd. The powder compound is introduced by pouring into the tube to tap density of approximately 4 g/cm$^3$. The copper clad niobium or niobium alloy tube is closed at each end using copper plugs and swaged tight. In the fifth step 525, the mono-element is mechanically processed using an industry standard cold drawing schedule until the mono-element is reduced to a desired diameter for assembly into a multifilament billet in step 530 for further processing to final wire diameter. The number of PIT sub-elements assembled in step 530 depends on the desired application and may vary from 19 to several hundred PIT sub-elements. The starting billet diameter of the multifilament billet may be up to 300 mm, with a starting length of up to 1000 mm long, for production-size processing using hot extrusion; alternatively, the starting billet diameter of the multifilament billet may be up to 100 mm, with a starting length of up to 5000 mm long, for production-size processing using cold drawing. After assembly, the billets are closed by welding a nose and lid. In the seventh step 535, the assembled multifilament billet is processed using either a hot extrusion process or a cold drawing process. Finally, in the eighth step 540, the multifilament billet is processed to a final desired wire diameter by cold drawing through a series of dies.

While the present invention has been described with respect to what is presently considered to be the preferred embodiment, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing $Nb_3Sn$ superconductor wire, the method comprising the steps of:
    producing a high-tin intermetallic powder compound;
    preparing a catalyst powder compound;
    mixing the high-tin intermetallic powder compound with the catalyst powder compound to produce an intermetallic powder mixture;
    introducing the intermetallic powder mixture into a tube to form a mono-element, the tube including copper cladding and the tube comprising one of niobium or a niobium alloy;
    cold-drawing the mono-element to a first predetermined diameter;
    assembling a plurality of mono-elements into a multi-element billet;
    hot-extruding the assembled multi-element billet to produce at least one multifilament billet containing $Nb_3Sn$; and
    forming a wire having a second predetermined diameter by cold-drawing the at least one multifilament billet through a plurality of dies;
    wherein the high-tin intermetallic compound comprises $MnSn_2$.

2. The method of claim 1, wherein the step of producing the high-tin intermetallic $MnSn_2$ compound comprises the steps of:
    introducing a first predetermined amount of elemental manganese into a mixer or shaker;
    introducing a second predetermined amount of elemental tin into the mixer or shaker;
    mixing the elemental manganese with the elemental tin to produce a combination of manganese and tin;
    subjecting the combination of manganese and tin to a heat treatment such that $MnSn_2$ is produced;
    mechanically grinding the produced $MnSn_2$ into a first plurality of particles having a particle size not exceeding a first predetermined maximum size; and
    jet milling the first plurality of particles into a second plurality of particles having a particle size not exceeding a second predetermined maximum size.

3. The method of claim 2, wherein the first predetermined amount of elemental manganese is approximately equal to 19% by weight of the combination of manganese and tin, and the second predetermined amount of elemental tin is approximately equal to 81% by weight of the combination of manganese and tin.

4. The method of claim 2, wherein the first predetermined amount of elemental manganese comprises a first plurality of manganese particles, each of the first plurality of manganese particles having a size less than or equal to 44 microns, and wherein the second predetermined amount of elemental tin comprises a second plurality of tin particles, each of the second plurality of tin particles having a size less than or equal to 44 microns.

5. The method of claim 2, wherein the step of mixing comprises mixing the manganese with the tin under an argon atmosphere.

6. The method of claim 2, wherein the step of subjecting the combination of manganese and tin to a heat treatment comprises subjecting the combination of manganese and tin to a temperature of approximately 500° C. for approximately 72 hours.

7. The method of claim 2, wherein the first predetermined maximum size is equal to 150 microns.

8. The method of claim 2, wherein the second predetermined maximum size is equal to 5 microns.

9. The method of claim 1, wherein the catalyst powder compound comprises CuTiSn.

10. The method of claim 1, wherein the step of mixing the high-tin intermetallic powder compound with the catalyst powder compound to produce an intermetallic powder mixture further comprises mixing a first amount of the high-tin intermetallic powder compound with a second amount of the catalyst powder compound to produce an intermetallic powder mixture, wherein the first and second amounts are selected in accordance with a predetermined ratio.

11. The method of claim 10, wherein the predetermined ratio is approximately equal to 1:1.

12. The method of claim 1, wherein when the tube comprises a niobium alloy, the niobium alloy is selected from the group consisting of the compositions of Nb-1% Zr, Nb-1% Zr-x % Gd, Nb-1% Zr-x % Y, and Nb-1% Zr-x % Nd.

\* \* \* \* \*